United States Patent [19]

Ninomiya

[11] 4,051,469
[45] Sept. 27, 1977

[54] CHARGE-COUPLED AMPLIFIER

[75] Inventor: Yuichi Ninomiya, Kawasaki, Japan

[73] Assignee: Nippon Hoso Kyokai, Tokyo, Japan

[21] Appl. No.: 635,076

[22] Filed: Nov. 25, 1975

[30] Foreign Application Priority Data
Nov. 29, 1974 Japan .................. 49-137229

[51] Int. Cl.$^2$ ............................... H03K 13/00
[52] U.S. Cl. ................................ 340/347 AD
[58] Field of Search ........ 330/30 R, 30 D, 69;
328/147, 149, 151; 357/24; 307/235 B, 235 C;
340/347 AD, 347 DA

[56] References Cited
U.S. PATENT DOCUMENTS

| | | | |
|---|---|---|---|
| 2,832,070 | 4/1958 | Bateman | 340/347 DA |
| 3,789,389 | 1/1974 | Lenhoff | 340/347 AD |
| 3,876,952 | 4/1975 | Weimer | 328/151 |

OTHER PUBLICATIONS

Norton, "IBM Technical Disclosure Bulletin," vol. 6, No. 3, Aug. 1963, p. 72.

Primary Examiner—Charles D. Miller
Attorney, Agent, or Firm—Stevens, Davis, Miller & Mosher

[57] ABSTRACT

A charge-coupled amplifier having a transistor used for transferring an electric charge between capacitors is provided with a charging means for charging the capacitor connected to an emitter of the transistor at a level of a sample-held signal voltage, and a differential signal voltage between the sample-held signal voltage and another sample-held signal voltage applied to a base is derived from a collector of the transistor with a delay of one sampling interval. So that, the charge-coupled amplifier has faculties of a differential amplifier and an analog shift register. Accordingly, a serial-parallel type A-D converting device having a high exactness can be formed simply by using the charge-coupled amplifier.

8 Claims, 7 Drawing Figures

CHARGE-COUPLED AMPLIFIER

BACKGROUND OF THE INVENTION

1. Field of the Invention

The present invention relates to a charge-coupled amplifier, which has a combined faculty of an analog shift register and a differential amlifier for amplifying a level difference between two signals with a favorably stable gain.

2. Description of the Prior Art

A conventional wide band differential amplifier having a favorably stable gain is formed mostly by such a means that a differential amplifier having a high gain in an open-loop condition is negatively fed back, so that the drift of the gain in the open-loop condition does not affect significantly the total gain of the differential amplifier. In this case, it is required that the gain in the open-loop condition be sufficiently high, and that the phase characteristics of the differential amplifier be so good that an oscillation does not occur in spite of the feed-back which is enough to obtain good stability. For reasons mentioned above, the conventional wide band and favorably stable differential amplifier is quite complicated. Besides, it is required that circuit elements used for it have good frequency characteristics, and consequently it is very difficult to utilize monolithic type integrated circuits having unfavorable frequency characteristics form a differential amplifier for use in the video frequency band.

Furthermore, to form a conventional device which can be used as an analog shift register as well as a differential amplifier, it is required to combine an appropriate switching means and an appropriate analog memory with the differential amplifier mentioned above. For instance, such a devicce is shown in FIG. 1. That is, an analog shift register 1 controlled by clock pulses CK as a charge-coupled device (C.C.D.) is connected to one of the input terminals of a differential amplifier 2, and has applied thereto a signal A ($t$) which is sample-held by a sample-holder 3. The shift register 1 then applies an output sample-held signal A($t$-$d$) shifted by a constant interval d to one of the input terminals of the differential amplifier 2. Another sample-holder 4 is connected to the other one of the input terminals of the differential amplifier 2, and then applies another sample-held signal B($t$-$d$) to the other input terminal. In this way, a differential signal between the two sample-held signals A($t$-$d$) and B($t$-$d$) is derived from the differential amplifier 2. Accordingly, it can be seen that the conventional device mentioned above is quite complicated.

SUMMARY OF THE INVENTION

It is an object of the present invention to provide a simply formed amplifier which has the characteristic of both an analog shift register and a differential amplifier for amplifying a level difference between two signals with a favorably stable gain.

According to the present invention, a conventional charge-coupled amplifier is modified as follows.

The conventional charge-coupled amplifier has a transistor, for example, a bipolar one, as an amplifying means, and two capacitors connected respectively to an emitting member, for example, an emitter, and to a draining member, for example, a collector, of the transistor.

In the charge-coupled amplifier formed as mentioned above, an electric charge stored in the capacitor connected to the collector is transferred to the one connected to the emitter through the transistor, by means of renewing a potential of either one or both of the capacitors in accordance with external pulsive voltages.

In a charge-coupled amplifier according to the present invention, a charging circuit is provided in parallel with the one formed of the transistor for charging the capacitor connected to the emitter wherein an input signal is applied through a diode. A potential at a terminal of the capacitor connected to the emitter is settled equal to or different by a constant value which corresponds to the voltage drop across the diode, from a voltage level of the input signal by the charging circuit described above. And then, an output signal corresponding to a difference between the voltage level of the input signal and a voltage level of another input signal applied to a controlling member, for example, a base, of the transistor is derived from the collector driven by the external pulsive voltages mentioned above and provided with a delay corresponding to the repetition interval of the external pulsive voltages. Consequently, the charge-coupled amplifier accorrding to the present invention is provided with a combined faculty of a differential amplifier and an analog shift register.

DESCRIPTION OF THE PREFERRED EMBODIMENTS

Figure 1:
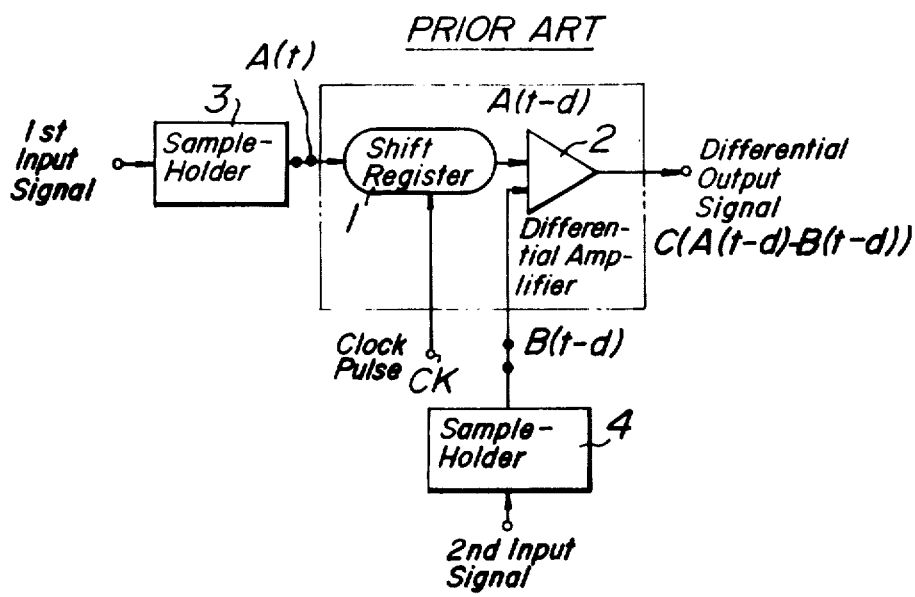
FIG. 1 is a block diagram showing a conventional device having a faculty of both of a differential amplifier and an analog shift register.
Figure 2:
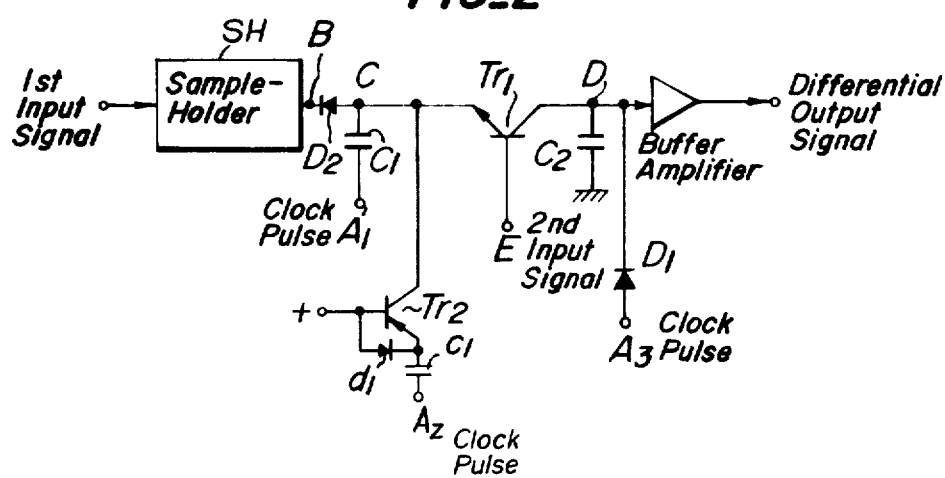
FIG. 2 is a circuit diagram showing a basic embodiment of a charge-coupled amplifier according to the present invention.
Figure 3:
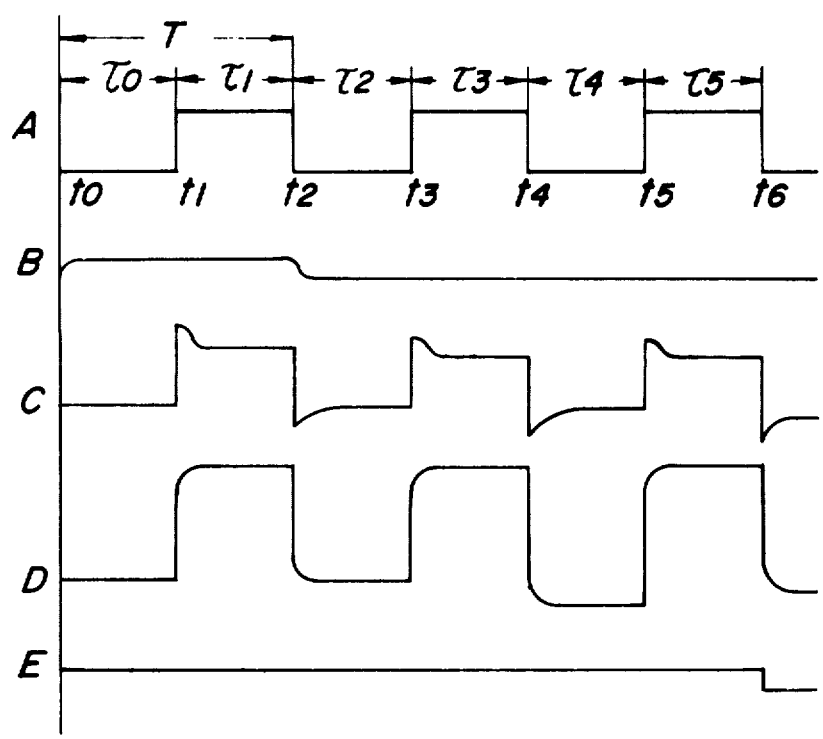
FIG. 3 is a diagram showing signal waveforms on various parts of the charge-coupled amplifier shown in FIG. 2.

FIG. 2 shows a circuit diagram of a basic embodiment of the charge-coupled amplifier according to the present invention, which consists of an npn-type bipolar transistor used for transferring an electric charge between capacitors connected to the transistor as mentioned above. FIG. 3 shows wave forms of signals on various parts of the basic emboidment shown in FIG. 2.

As shown in FIG. 2, capacitors $C_1$ and $C_2$ are connected respectively to an emitter and a collector of a transistor $Tr_1$. A potential at a connecting point C whereon a terminal of the capacitor $C_1$ is connected to the emitter is renewed in accordance with a driving pulsive voltage applied to another terminal $A_1$ of the capacitor $C_1$. When the potential at the connecting point C is lowered, below the potential E at the base of the transistor $Tr_1$ a positive charge stored in the capacitor $C_2$ is transferred to the capacitor $C_1$ through the transistor $Tr_1$. Another transistor $Tr_2$ forms a charging circuit for charging the capacitor $C_1$, and is controlled by the driving pulsive voltage applied to a terminal $A_2$ and further an output terminal B of a sample-holder SH is connected to the connecting point C through a directional device, for example, a diode $D_2$. In case the potential at the connecting point C rises in accordance with charging of the capacitor $C_1$ by the above-mentioned charging circuit beyond a potential at the output terminal B, an excessive electric charge flows from the capacitor $C_1$ into the output terminal B through the directional device, so that the potential at the connecting point C becomes equal to or different from the potential at the output terminal B, by a constant value corresponding to the voltage drop across the directional device.

Thus, the potential at the output terminal B shows a voltage level of a first input signal sample-held by the sample holder SH.

Another diode $D_1$ forms a charging circuit for charging the capacitor $C_2$, and is controlled by the driving pulsive voltage applied to a terminal $A_3$ so as to drive the potential at a connecting point D, at which a terminal of the capacitor $C_2$ is connected to the collector, to constant potential which is almost equal to the higher level of the driving pulsive voltage. And then, the base E of the transistor $Tr_1$ has applied thereto a second input signal voltage which is sample-held in the same way as the first input signal;

It is supposed that the terminals $A_1$, $A_2$ and $A_3$ have applied thereto the same driving pulsive voltages having a clock period T as shown by the wave form A in FIG. 3. At an instant $t_1$; that is, at the beginning of the interval $\tau_1$ whereat the driving pulsive voltages A applied to the terminals $A_1$, $A_2$ and $A_3$ increase, the voltage across capacitor $C_1$ is increased by a voltage step of the driving pulsive voltage A, applied to the terminal $A_1$ so that, as shown by the wave-form C in FIG. 3, the potential at the connecting point C increases, and then the transistor $Tr_2$ becomes conductive as discussed later. Consequently, during the interval $t_1$, a positive charge is put into the capacitor $C_1$ through the transistor $Tr_2$, and then the capacitor $C_1$ is charged.

In the state mentioned above, the excessive electric charge flows from the capacitor $C_1$ into the sample-holder SH through the diode $D_2$, so that, as shown by the wave form C in FIG. 3, during the interval $t_1$; that is, when the driving pulsive voltages are at a higher level, the potential at the connecting point C is finally driven to a level corresponding to the sum of the voltage level of the first input signal shown by the wave form B in FIG. 3, which is sample-held by the sample holder SH at an instant $t_0$ and appears at its output terminal B, and the voltage drop across the diode $D_2$.

The positive charge mentioned above is put into the capacitor $C_1$ as follows. When the driving pulsive voltage A applied to the terminal $A_2$ is at a lower level, a diode $d_1$ is conductive, and a capacitor $c_1$ connected to the emitter of the transistor $Tr_2$ is charged by a positive voltage source applied to the base of the transistor $Tr_2$ through the diode $d_1$, and in this state the transistor $Tr_2$ is cut off. When the capacitor $c_1$ is charged up by the voltage step of the driving pulsive voltage A applied to the terminal $A_2$, the diode $d_1$ is cut off and then the transistor $Tr_2$ becomes conductive, a positive charge stored in the capacitor $c_1$ flows into the capacitor $C_1$ through the transistor $Tr_2$, so that the capacitor $C_1$ is charged and the potential at the connecting point C increases.

At the next instant $t_2$; that is, at the beginning of the interval $\tau_2$, whereat the driving pulsive voltages A decrease, and the voltage across capacitor $C_1$ is decreased by the voltage step of the driving pulsive voltage A, the potential at the connecting point C drops, as shown by the wave form C in FIG. 3, so that, the transistor $Tr_1$ becomes conductive and at the same time the capacitor $c_1$ is charged through the diode $d_1$ as mentioned earlier, and then the transistor $Tr_2$ is cut off. Accordingly, a positive charge stored previously in the capacitor $C_2$ by the charging circuit consisting of the diode $D_1$ in the interval $t_1$ flows into the capacitor $C_1$ through the transistor $Tr_1$, so that during the interval $t_2$; that is, when the driving pulsive voltage are at a lower level the potential at the connecting point C is settled finally at a level corresponding to a sum of the voltage level of the second input signal shown by the wave form E in FIG. 3, which appears at the base E of the transistor $Tr_1$, and a voltage which appears between the base and the emitter of the transistor $Tr_1$.

In the state mentioned above, since the capacitor $C_2$ has been previously charged at the constant potential through the diode $D_1$ by the voltage step of the driving pulsive voltage A which appeared on the terminal $A_3$ at the instant $t_1$, the potential which appears at the connecting point D in an interval $\tau_2$, that is, from the instant $t_2$ to an instant $t_3$, corresponds to the level difference between the potential which appears at the base E in this interval $\tau_2$ and the potential which has appeared at the connecting point C in the proceding interval $\tau_1$, as shown by the wave form D in FIG. 3. As mentioned above, the potential at the point C in the interval $\tau_1$ is the sum of the voltage drop across the diode $D_2$ and the potential at the terminal B, that is, the voltage level of the first input signal which has been sample-held at the instant $t_0$ by the sample-holder SH. Consequently the amount of positive electric charge transferred through the transistor $Tr_1$ from the capacitor $C_2$ to the capacitor $C_1$ corresponds to the level difference between the potential at the connecting point C appearing when the driving pulsive voltages are at the higher level and the one appearing when the driving pulsive voltages are at the lower level; namely, between the first input signal appearing at the output terminal B of the sample-holder SH and the second input signal appearing at the base E of the transistor $Tr_1$.

Similarly, in an interval $\tau_3$, that is, from the instant $t_3$ to an instant $t_4$, the capacitor $C_1$ is charged through the transistor $Tr_2$, and then the potential at the connecting point C is settled finally at the level corresponding to a sum of the voltage drop across the diode $D_2$ and the voltage level of the first input signal which has been sample-held by the sample-holder SH at the instant $t_2$ and has appeared at the terminal B.

In an interval $\tau_4$, that is, from the instant $t_4$ to an instant $t_5$, the positive charge stored in the capacitor $C_2$ flows into the capacitor $C_1$ through the transistor $Tr_1$, so that the potential at the connecting point C is settled finally at the level corresponding to the sum of the voltage level of the second input signal which appears at the base E of the transistor $Tr_1$ and the voltage which appears between the base and the emitter of the transistor $Tr_1$. Accordingly, the potential at the connecting point D corresponds to a level difference between the potential which appears at the base E in the interval $\tau_4$ and the potential which has appeared at the connecting point C in the preceding interval $\tau_3$, that is, the sum of the voltage drop across the diode $D_2$ and the potential at the terminal B which has appeared at the instant $t_2$.

In the following intervals $\tau_5$ and so forth, the same is repeated.

Consequently, the charge-coupled amplifier mentioned above has a faculty for amplifying the level difference between the potential at the terminal B, that is, the voltage level of the first input signals, which has been shifted by one clock interval T, and the potential at the base E, that is, the voltage level of the second input signal. Furthermore, this charge-coupled amplifier has a very stable voltage amplification factor K shown by the following equation.

$$K = C_1^0/C_2^0$$

where, $C_1^0 = C_1 + C^{01}$, $C_2^0 = C_2 + C^{02}$, and $C^{01}$ and $C^{02}$, show respectively stray capacitances appearing around the capacitors $C_1$ and $C_2$ because the terminal voltage ratio between two capacitors is inversely proportioned to the ratio of their overall capacitances, in case an amount of electric charge is transferred between them. Additionally, a buffer amplifier BA having such a high input and a low output impendance as in an emitter follower is connected to the point D, as shown in FIG. 2, for the purpose of facilitating ordinary uses of this charge-coupled amplifier notwithstanding its high output impedance.

An output signal, that is, the potential appearing at the point D, is obtained, as shown by the wave form D in FIG. 3, in a form of a pulsive amplitude-modulated signal of return-to-zero (RZ) type. Nevertheless, the output signal of this charge-coupled amplifier can be reformed, if necessary, in a form of a sample-held signal of non-return-to-zero (NRZ) type by means of sample-holding the signal mentioned above of the RZ type with a pulse train having an adequate pulse interval. Moreover, the driving pulsive voltages applied respectively to the terminals $A_1$, $A_2$ and $A_3$ are not necessarily required to be the same ones, and it is possible to apply such pulsive voltages different from each other to the respective terminals, that timings, duty cycles and amplitudes are settled suitably enough any more to smooth the operations on respective parts of this amplifier. For instance, the pulsive voltages driving respectively the charging circuit for the capacitors $C_1$ and $C_2$ can be reduced in their pulse width and staggered with each other, so as to elongate an interval available for transferring the electric charge between the capacitors.

As mentioned above, the charge-coupled amplifier according to the present invention has the faculties of an analog shift register and besides of a differential amplifier for amplifying a voltage difference between two signals applied to it. On the other hand, a conventional analog to digital converting device of the serial parallel type, wherein an output digital signal is formed separately into several groups of bits, consists of several analog to digital converting means, namely, several simple A-D converters, for forming the respective groups of bits, several digital to analog converting means, namely, several simple D-A converters for converting the several groups of bits to respective analog signals, several analog shift registers, several differential amplifiers for obtaining successive differences between the respective analog signals and another A-D converting means for forming a group of the lowest bits, so that the conventional A-D converting device of the serial parallel type is complicated and unstable. In contrast, a simplified high grade analog to digital converting device having a high stability and a high exactness can be realized with the use of the charge-coupled amplifier according to the present invention for forming the serial parallel type A-D converting device as mentioned above.

Figure 4:
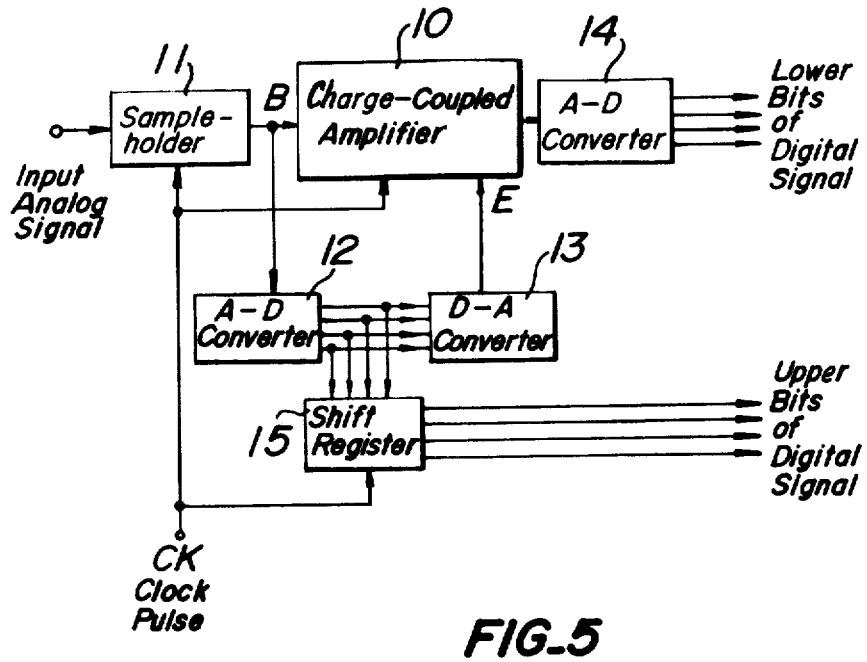
FIG. 4 is a bock diagram showing an example of an analog to digital converting device consisting of the charge-couple amplifier and others according to the present invention.

FIG. 4 shows an example of the simplified high grade A-D converting device mentioned above, wherein two groups of upper and lower bits are formed separately.

In an analog to digital converting device shown in FIG. 4, a sample-held analog signal derived from a sample-holder 11 is shifted by one clock interval in a charge-coupled amplifier 10 of the present invention, and meanwhile this sample-held analog signal is converted to a digital signal corresponding to a higher order level of said analog signal, that is, upper bits of an output digital signal, by a simple A-D converter 12. The upper bits of the output digital signal are converted reversely to an analog signal having a higher order level of the sample-held analog signal by a digital to analog (D-A) converter 13.

In the charge-coupled amplifier 10, a differential analog signal between the sample-held analog signal applied to the terminal B shown in FIG. 2 and then shifted adequately as mentioned above and the higher order level analog signal applied to the base E shown in FIG. 2, which is delayed in the above-mentioned converting process is formed as a lower order level analog signal provided with a delay of one clock interval. The differential analog signal derived from the charge-coupled amplifier 10 is applied to a simple A-D converter 14, and is converted to a digital signal corresponding to a lower order level of the sample-held analog signal, that is, lower bits of the output digital signal. The upper bits of the digital signal derived from the A-D converter 12 are applied also to a digital shift register 15, and is shifted so as to match a timing between the upper bits and the delayed lower bits of the required digital signal. Besides, the same clock pulses are applied to the sample-holder 11, the charge-coupled amplifier 10 and the digital shift register 15 so as to synchronize the operations in these means.

Figure 5:
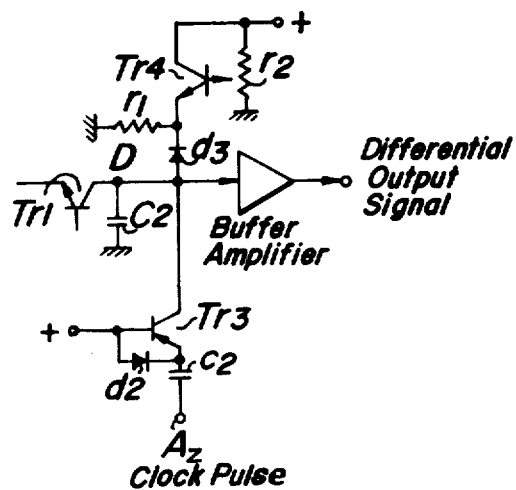
FIG. 5 is a circuit diagram showing a portion of a further embodiment of the charge-coupled amplifier according to the present invention.

As a matter of course, the preferable embodiments of the charge-coupled amplifier according to the present invention are not restricted to the one explained above, and variously modified ones can be realized. For instance, with respect to the embodiment shown in FIG. 2, such different type transistors as field effect type transistors (FET) can be substituted for bipolar transistors used for the transistors $Tr_1$ and $Tr_2$. Furthermore, in place of the diode $D_1$ which forms the charging circuit for charging the capacitor $C_2$, a transistor $Tr_3$ can be used as shown in FIG. 5. That is, the transistor $Tr_3$ forms a charging circuit together with a diode $d_2$ and a capacitor $C_2$ as in the charging circuit for charging the capacitor $C_1$. Besides, the charging circuit shown in FIG. 5 is accompanied by constant level settling means connected through a directional device, for example, a diode $d_3$, which consists of a transistor $Tr_4$, a resistor $r_1$ and a potentiometer $r_2$ and acts as an emitter follower supplying a constant dc voltage with a low output impedance, and wherein the potentiometer is use for adjusting the output dc voltage to be settled at an adequate level, so that the means operates as a constant voltage source alike to a battery. Accordingly, in such a case that the potential at the connecting point D of the capacitor $C_2$ is about to exceed a constant level settled by the potentiometer $r_2$, an excessive electric charge supplied by the charging circuit consisting of the transistor $Tr_3$ as mentioned above flows out through the diode $d_3$ to the resistor $r_1$, so that during the charging process of the capacitor $C_2$, the potential at the point D is maintained at the constant level settled by an emitter follower consisting of the transistor $Tr_4$ as mentioned above.

It is possible to increase the charging velocity by increasing the charging amount owing to the current amplification of the transistor $Tr_3$ forming the charging circuit shown in FIG. 5, and besides it is possible to improve the constancy of the charging voltage level and to remove interference affected by other circuit components, by using the constant level settling means shown in FIG. 5. Similarly it is possible to improve the constancy of a charging voltage level of the charging circuit consisting of the diode $D_1$ shown in FIG. 2 by means of adding the constant level settling means mentioned above to said charging circuit, wherein the constancy of the charging voltage level is maintained by a constancy of a level and a duration of the driving pulsive voltage A applied to the diode $D_1$.

Figure 6:
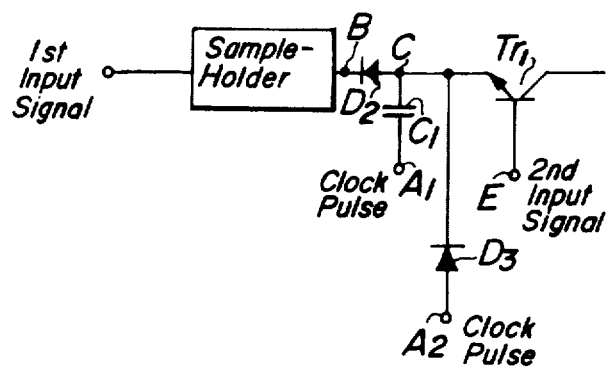
FIG. 6 is a circuit diagram showing a portion of still another embodiment of the charge-coupled amplifier according to the present invention.

Contrarily, it is possible to simplify the charging circuit used for charging the capacitor $C_1$ by replacing that shown in FIG. 2 by another circuit consisting of a diode $D_3$ as shown in FIG. 6, similar to the charging circuit consisting of the diode $D_1$ for charging the capacitor $C_2$ as shown in FIG. 2.

As mentioned before, in the charge-coupled amplifier shown in FIG. 2, the output signal voltage corresponds to the level difference between the second input signal voltage applied to the base E of the transistor $Tr_1$ and the potential at the connecting point C of the emitter of the transistors $Tr_1$. However, the potential at the point C does not indicate directly the voltage level of the first input signal, but indicates a level corresponding to the sum of the first input signal voltage and the voltage drop across the diode $D_2$. Accordingly, it is sometimes preferable to decrease the voltage drop added to the first input signal voltage.

Figure 7:
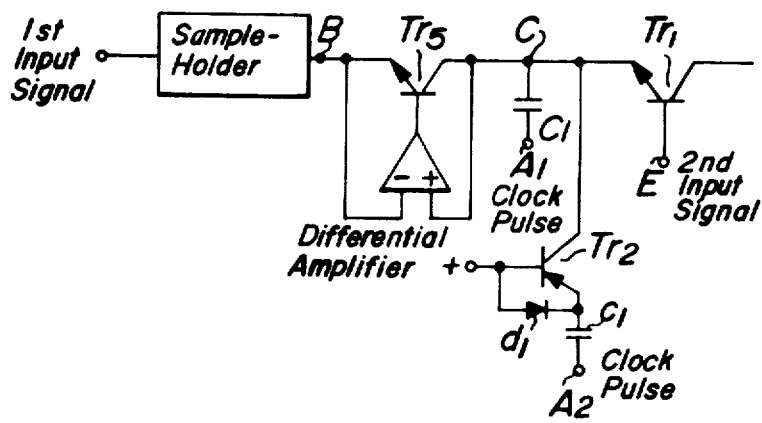
FIG. 7 is a circuit diagram showing a portion of a still further embodiment of the charge-coupled amplifier according to the present invention.

In such a case, it is possible to substitute a diode-connection FET for the diode $D_2$, because the former shows a very small voltage drop and a better response than the latter. Furthermore, it is possible for the same reason to substitute a circuit consisting of a transistor $Tr_5$ and a differential amplifier DA as shown in FIG. 7. In this substituted circuit, a collector and an emitter of the transistor $Tr_5$ are connected respectively to input terminals of the differential amplifier DA, and an output terminal of the differential amplifier DA is connected to the base of the transistor $Tr_5$ so that the voltage difference between the collector and the emitter of the transistor $Tr_5$ is amplified and negatively fed back to the base of the transistor $Tr_5$ by the differential amplifier DA. Accordingly, when the potential at the connecting point C of the emitter of the transistor $Tr_1$ is about to exceed the potential at the output terminal B of the sample-holder SH, that is, the voltage level of the first input signal sample-held by the sample-holder SH, and then the transistor $Tr_5$ becomes conductive, the voltage drop across transistor $Tr_5$ is reduced to a negligible amount, and then the potential at the point C is settled at the potential at the terminal B, that is, at the voltage level of the sample-held first input signal.

Still further, in place of the npn-type bipolar transistor $Tr_1$ for transferring the electric charge as shown in FIG. 2, a pnp-type bipolar transistor can be used according to the present invention. However, in this case, a negative charge is transferred through the transistor $Tr_1$, so that is is required to reverse the polarities of the other circuit elements, the applied pulsive voltages, and the input signals.

The charge-coupled amplifier which can be added, according to the present invention, with the charging means for charging the capacitors connected respectively to the emitter and to the collector of the transistor used for transferring the electric charge, is never restricted to the examples explained above, and all kinds of so called charge-coupled amplifiers can be used for the application of the present invention, regardless of their forms and their operations.

What is claimed is:

1. A charge-coupled amplifier comprising:
 a first transistor having first, second and third electrodes,
 a first capacitor having one end connected at a first connecting point to the first electrode of said first transistor, a first pulse voltage being applied to the other end of said first capacitor,
 a second capacitor having one end connected at a second connecting point to the second electrode of said first transistor and the other end being maintained at a reference potential,
 a first directional device having one terminal connected to said first connecting point, a second pulse voltage being applied to a second terminal of said first directional device for charging said first capacitor,
 a sample-holder,
 a second directional device coupled between said first connecting point and the output of said sample-holder for sampling and holding a first input signal applied to said sample-holder in response to a third pulse voltage, said second directional device providing a path for charging said first capacitor so that the voltage across said first capacitor is maintained at a level corresponding to that of said first input signal,
 a third directional device having one terminal coupled to said second connecting point, a fourth pulse voltage being applied to a second terminal of said third directional device for charging said second capacitor so that the voltage across said second capacitor is maintained at a constant level, and,
 means for applying a second input signal to the third electrode of said first transistor, whereby an electric charge corresponding to the level difference between said first and second input signals is transferred periodically through said first transistor from said second capacitor to said first capacitor in response to said first, second, third and fourth pulse voltages so that an output signal corresponding to said level difference between said first and second input signals appears at said second connecting point.

2. A charge-coupled amplifier as defined by claim 1 wherein the first, second and third electrodes of said first transistor correspond to the emitter, collector and base thereof respectively, said first directional device comprises a second transistor having a collector connected to said first connecting point and a diode connected between the base and emitter of said second transistor, and said third directional device is a diode.

3. A charge-coupled amplifier as defined by claim 1 wherein said first directional device is a diode.

4. A charge-coupled amplifier as defined by claim 1 wherein said third directional device comprises a third transistor having a collector connected to said second connecting point and a diode connected between the base and emitter of said third transistor.

5. A charge-coupled amplifier as defined by claim 4 which further comprises a diode having its anode connected to said second connecting point, a fourth transistor having a collector connected to a d.c. voltage source and an emitter connected to the cathode of said diode, and a load resistor coupled to the junction of said diode and the emitter of said fourth transistor.

6. A charge-coupled amplifier as defined by claim 1 wherein said second directional device is a diode.

7. A charge-coupled amplifier as defined by claim 1 wherein said second directional device comprises a fifth transistor having a collector coupled to said first connecting point and an emitter coupled to the output of said sample holder, and a differential amplifier having first and second inputs connected to the emitter and collector of said fifth transistor respectively and an output coupled to the base of said fifth transistor.

8. In combination with a charge-coupled amplifier, an analog to digital converting device comprising:
 a sample-holder for storing an input analog signal coupled to the input of said charge-coupled amplifier,
 a first analog-to-digital converter coupled to the junction between the output of said sample-holder and the input of said charge-coupled amplifier, said first analog-to-digital converter converting the analog signal at the output of said sample-holder to upper bits of a digital signal,
 a digital-to-analog converter coupled to the output of said first analog-to-digital converter and to said charge-coupled amplifier for converting said upper bits to an analog signal and coupling said analog signal to said charge-coupled amplifier, said amplifier delaying the analog signal from the sample-holder and acting as a differential amplifier, and
 a second analog-to-digital converter coupled to the output of said charge-coupled amplifier, said second analog-to-digital converter converting the differential output analog signal at the output of said charge-coupled amplifier to lower bits of said digital signal.

* * * * *